(12) United States Patent
Thompson et al.

(10) Patent No.: US 7,456,463 B2
(45) Date of Patent: Nov. 25, 2008

(54) CAPACITOR HAVING ELECTRODES AT DIFFERENT DEPTHS TO REDUCE PARASITIC CAPACITANCE

(75) Inventors: Eric Thompson, Burlington, VT (US); Anil K. Chinthakindi, Manassas, VA (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 11/671,614

(22) Filed: Feb. 6, 2007

(65) Prior Publication Data

US 2008/0186651 A1    Aug. 7, 2008

(51) Int. Cl.
*H01L 27/108* (2006.01)
*H01L 29/94* (2006.01)

(52) U.S. Cl. .............. 257/308; 438/239; 257/296
(58) Field of Classification Search ............ 438/239; 257/296, E27.084, E27.086, E27.087
See application file for complete search history.

(56) References Cited

U.S. PATENT DOCUMENTS

| | | | |
|---|---|---|---|
| 6,251,740 B1 | 6/2001 | Johnson et al. | |
| 6,342,734 B1 | 1/2002 | Allman et al. | |
| 6,411,419 B1 | 6/2002 | Johnson et al. | |
| 6,417,535 B1 | 7/2002 | Johnson et al. | |
| 6,426,249 B1 * | 7/2002 | Geffken et al. | 438/239 |
| 6,504,202 B1 | 1/2003 | Allman et al. | |
| 6,822,312 B2 | 11/2004 | Sowlati et al. | |
| 6,891,219 B2 | 5/2005 | Allman et al. | |
| 6,964,908 B2 | 11/2005 | Hsu et al. | |
| 2004/0164339 A1 | 8/2004 | Felsner et al. | |
| 2007/0158717 A1 * | 7/2007 | Edelstein et al. | 257/296 |

\* cited by examiner

*Primary Examiner*—Kimberly D Nguyen
*Assistant Examiner*—Mamadou Diallo
(74) *Attorney, Agent, or Firm*—Joseph Petrokaitis; Hoffman Warnick LLC

(57) ABSTRACT

Capacitors are disclosed having reduced parasitic capacitance. In one embodiment, the capacitor includes a first set of electrodes, each electrode of the first set extending through at least one of a plurality of back-end-of-line (BEOL) layers above a substrate; a second set of electrodes, each electrode of the second set extending through at least one of the BEOL layers, and wherein each electrode of the second set extends to a greater depth of the plurality of BEOL layers than each electrode of the first set.

1 Claim, 6 Drawing Sheets

US 7,456,463 B2

CAPACITOR HAVING ELECTRODES AT DIFFERENT DEPTHS TO REDUCE PARASITIC CAPACITANCE

BACKGROUND OF THE INVENTION

1. Technical Field

The invention relates generally to integrated circuit (IC) chips, and more particularly, to a capacitor having electrodes extend to different depths to reduce parasitic capacitance.

2. Background Art

Vertical natural (VN) capacitors are used in integrated circuit (IC) chips. FIG. 1 shows one illustrative conventional capacitor 8 in which inter-digitated cathodes 10 and anodes 12 are generated in layers of an IC chip. Quality of capacitor 8 is defined mainly by resistance of inter-digitated electrodes 10, 12, and parasitic capacitance coupling to an underlying substrate 14. Quality can be improved by reducing resistance and parasitic capacitance. Parasitic capacitance to underlying substrate 14 or underneath wiring 16 of capacitor 8 is mainly due to the fringe capacitance of inter-digitated electrodes 10, 12 and the parasitic capacitance of a bottom level 18 of capacitor 8. One approach to reduce the parasitic capacitance to underlying substrate 14 is to move bottom level 18 of capacitor 8 away from underlying substrate 14 to a higher back-end-of-line (BEOL) layer. Unfortunately, this approach also greatly reduces the main capacitance of capacitor 8.

SUMMARY OF THE INVENTION

Capacitors are disclosed having reduced parasitic capacitance. In one embodiment, the capacitor includes a first set of electrodes, each electrode of the first set extending through at least one of a plurality of back-end-of-line (BEOL) layers above a substrate; a second set of electrodes, each electrode of the second set extending through at least one of the BEOL layers, and wherein each electrode of the second set extends to a greater depth of the plurality of BEOL layers than each electrode of the first set.

A first aspect of the invention provides a capacitor comprising: a first set of electrodes, each electrode of the first set extending through at least one of a plurality of back-end-of-line (BEOL) layers above a substrate; a second set of electrodes, each electrode of the second set extending through at least one of the BEOL layers, and wherein at least one electrode of the second set extends to a greater depth of the plurality of BEOL layers than each electrode of the first set.

A second aspect of the invention provides a capacitor comprising: a first set of electrodes, each electrode of the first set extending through at least one of a plurality of back-end-of-line (BEOL) layers above a substrate; a second set of electrodes, each electrode of the second set extending through at least one of the BEOL layers, and wherein a BEOL layer closest to the substrate includes fewer electrodes than at least one layer farther from the substrate.

A third aspect of the invention provides a capacitor comprising: a first set of electrodes extending from a first common hub, the first set of electrodes having at least one electrode vertically and horizontally interspersed between at least two electrodes of a second set of electrodes extending from a second common hub; wherein the second set of electrodes are positioned at a greater depth in a plurality of back-end-of-line (BEOL) layers above a substrate than the first set of electrodes.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
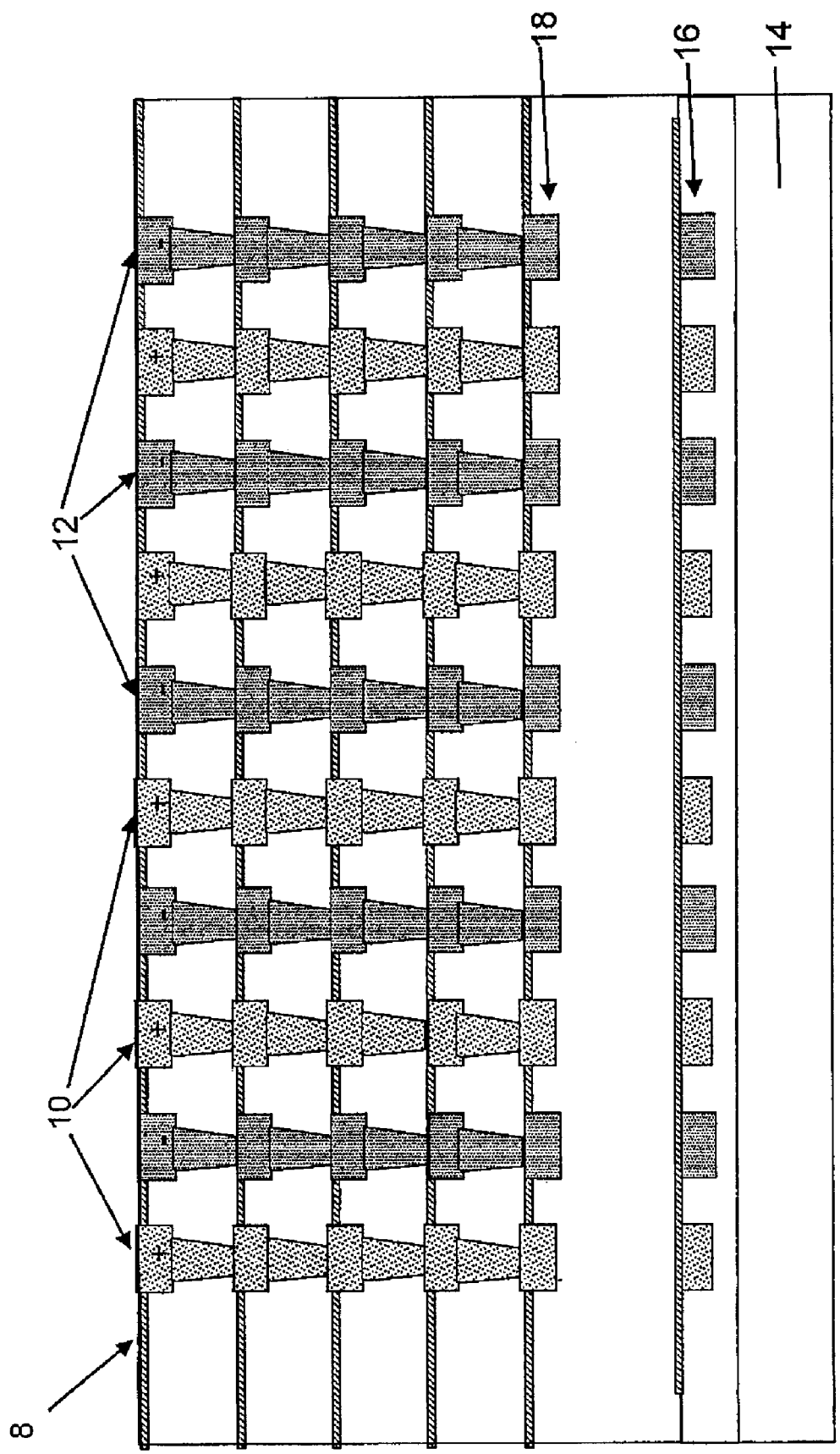
FIG. 1 shows a cross-sectional view of a conventional capacitor.

Referring to the drawings, various embodiments of a capacitor are illustrated. FIGS. 2 and 3A-D show a first embodiment of a capacitor 100. Capacitor 100 is positioned in a plurality of back-end-of-line (BEOL) layers 102 above a substrate 104 in an integrated circuit (IC) chip 106, other parts of which are not shown. BEOL layers 102 may be any interconnect layers above a first metal layer of IC chip 106. Each BEOL layer 102 may include a dielectric material 108 through which interconnects, i.e., vias and wiring, extend. Capacitor 100 is formed from a special arrangement of interconnects, as will be described herein.

Figure 2:
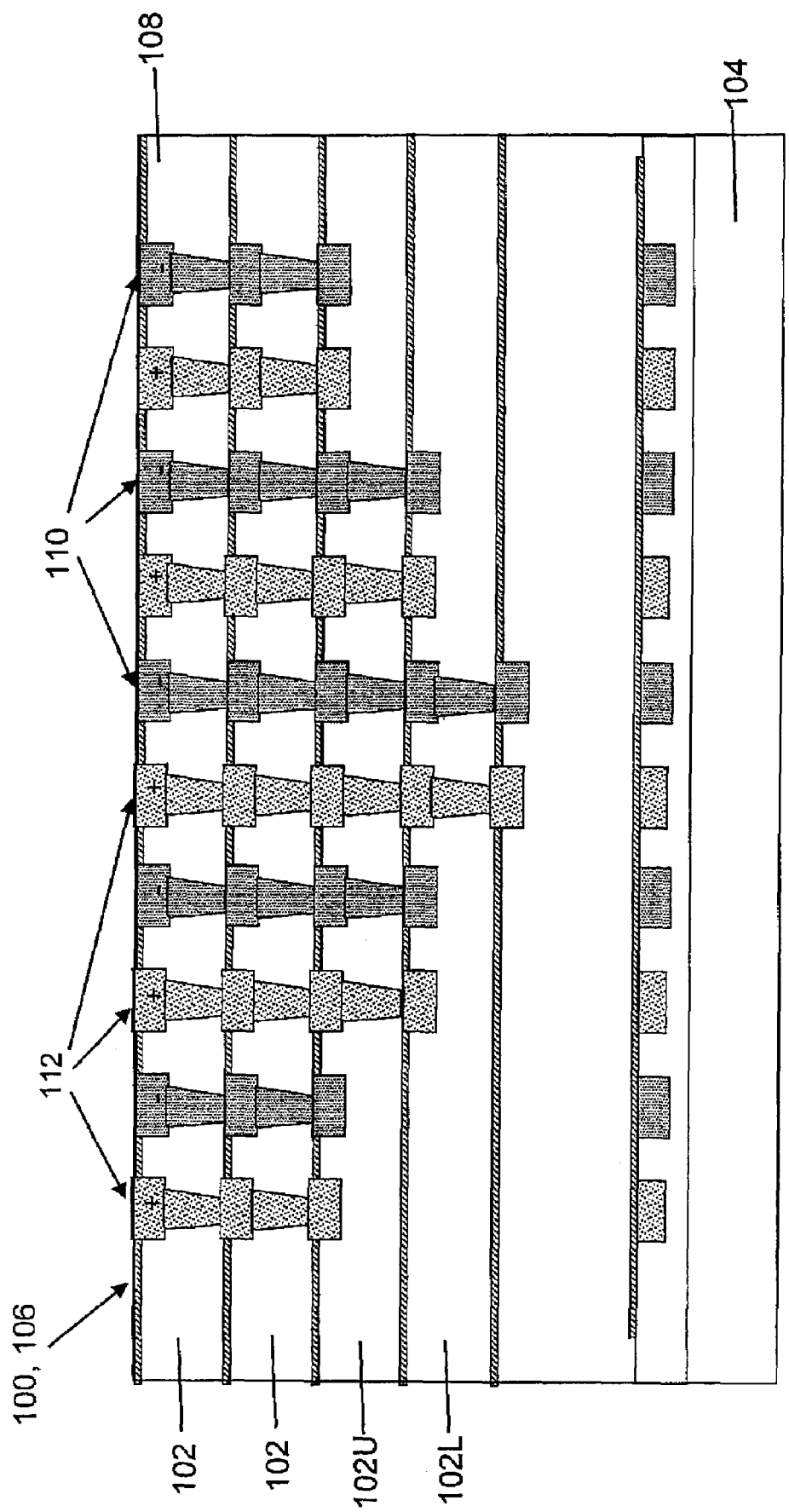
FIG. 2 shows a cross-sectional view of a first embodiment of a capacitor.

In FIG. 2, a first set of electrodes 110 is illustrated in which each electrode thereof extends through at least one of BEOL layers 102 above substrate 104, and a second set of electrodes 112 is illustrated in which each electrode thereof extends through at least one of BEOL layers 102. A BEOL layer 102L closest to substrate 204 includes fewer electrodes than at least one BEOL layer 102U farther from substrate 204. In one embodiment, second set of electrodes 112 include a cathode and first set of electrodes 110 include an anode. In one embodiment, as shown, each BEOL layer 102 includes more electrodes than a BEOL layer 102 therebelow, i.e., one closer to substrate 104. This arrangement reduces the amount of parasitic capacitance to substrate 104 exhibited by conventional capacitors (FIG. 1). In particular, since fewer anodes (first set of electrodes 110) are close to substrate 104, less parasitic capacitance to substrate 104 is allowed. However, since the same number of electrodes 110, 112 are provided, the main capacitance of capacitor 100 is maintained.

Figure 3A:
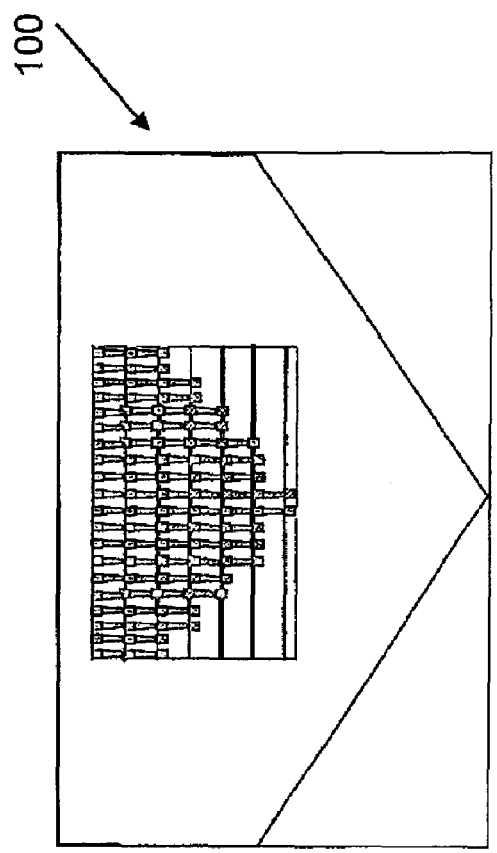
FIGS. 3A-3D show a schematic cross-sectional view of alternative embodiments of the capacitor of FIG. 2.
Figure 3B:
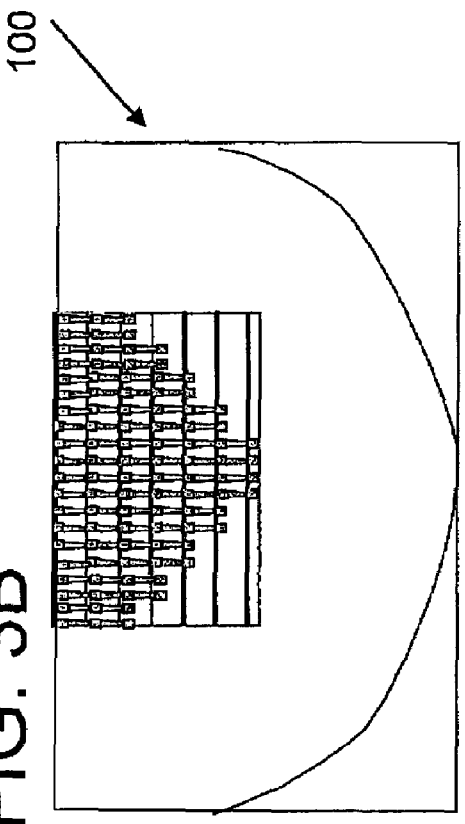
Figure 3C:
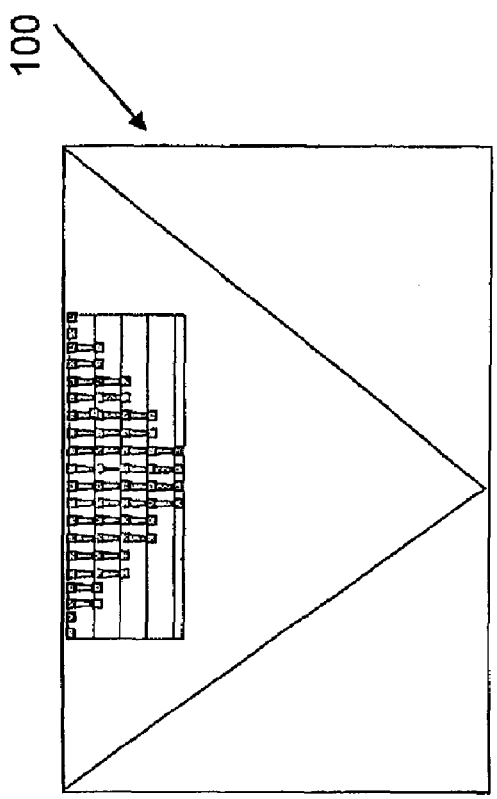
Figure 3D:
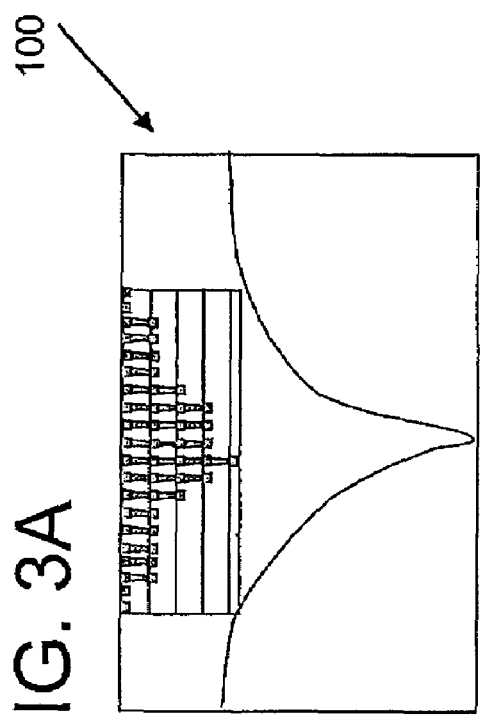

FIGS. 3A-D illustrate how a cross-sectional profile of capacitor 100 may vary. FIG. 3A illustrates one embodiment, as also shown in FIG. 2, in which first and second set of electrodes 110, 112 (FIG. 2) have a substantially pointed cross-sectional profile. FIG. 3B shows substantially similar arrangement, but with more layers and electrodes that extend deeper into more BEOL layers 102 (FIG. 2) than that of capacitor 100 in FIG. 2. FIG. 3C shows another variation in which first and second set of electrodes 110, 112 may have a substantially arced point cross-sectional profile; and FIG. 3D shows another variation in which first and second set of electrodes 110, 112 may have a substantially U-shaped cross-sectional profile. Other cross-sectional profiles may also be possible and are considered within the scope of the invention.

Figure 4:
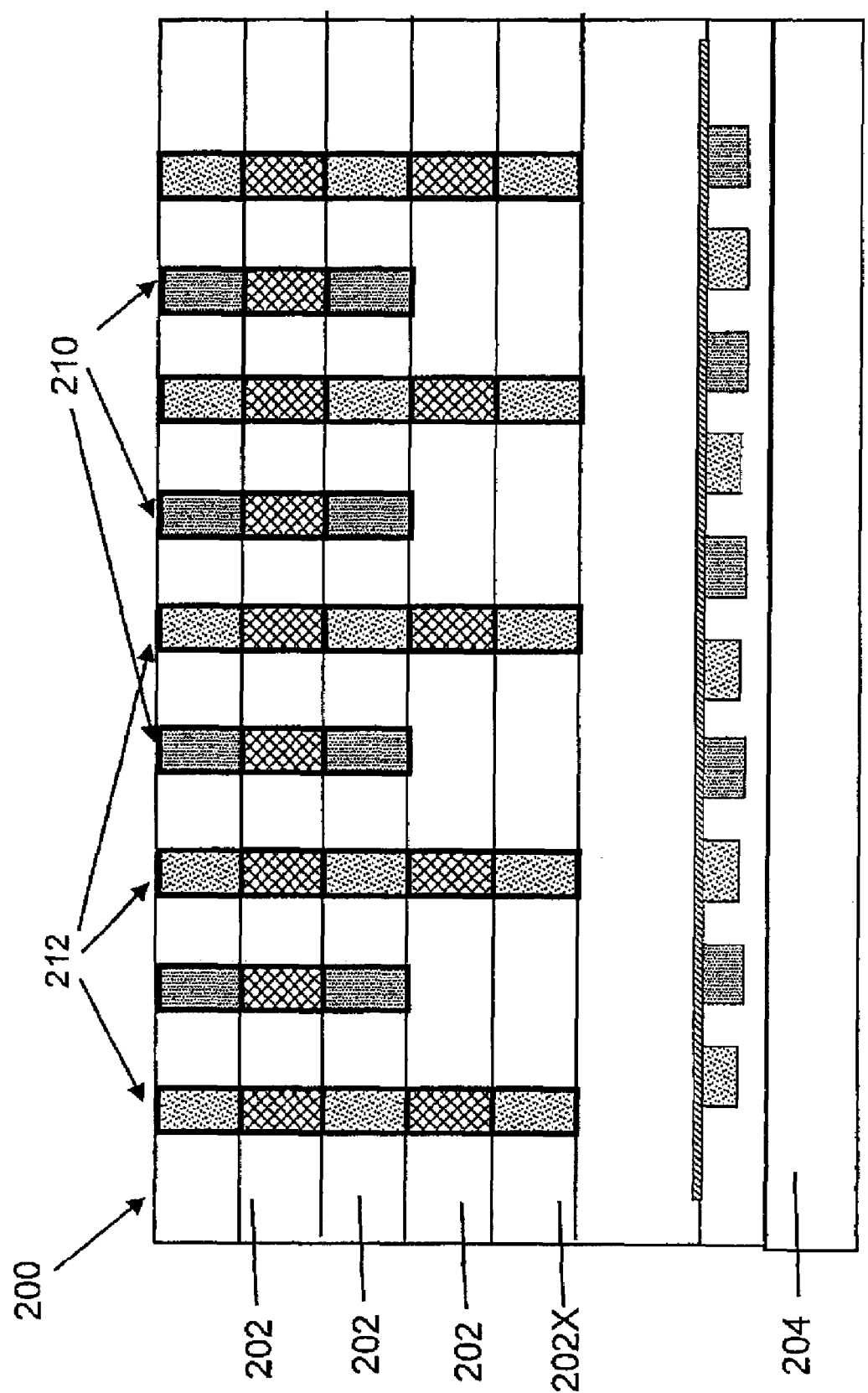
FIG. 4 shows a cross-sectional view of a second embodiment of a capacitor.

FIG. 4 shows a second embodiment of a capacitor 200 including a plurality of BEOL layers 202 over a substrate 204. A first set of electrodes 210 is illustrated in which each electrode thereof extends through at least one of BEOL layers 202 above substrate 204, and a second set of electrodes 212 is illustrated in which each electrode thereof extends through at least one of BEOL layers 102. In this case, second set of electrodes 212, however, extend to a greater depth of BEOL layers 202 than first set of electrodes 210. Second set of electrodes 212 may include a cathode and first set of electrodes 210 may include an anode. This arrangement reduces parasitic capacitance to substrate 204 by distancing the anode (first set 210), but maintains overall capacitance via the cathode (second set 212). One of the first and second set of electrodes 210, 212 may also be laterally outside of the other set of electrodes. In the illustrated embodiment, second set of electrodes 212 including a cathode is arranged such that the cathode is laterally outside of the anode (first set 210), i.e., the anode is always laterally inside of the cathode. This arrangement further reduces sidewall parasitic capacitance.

Figure 5A:
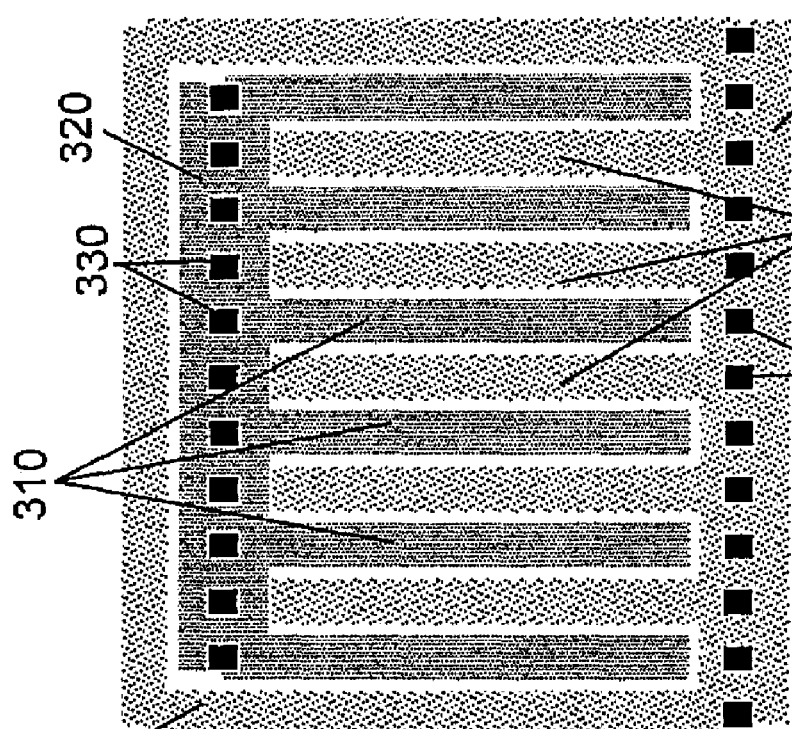
FIGS. 5A-5B shows a top view different layers of a third embodiment of a capacitor.
Figure 5B:
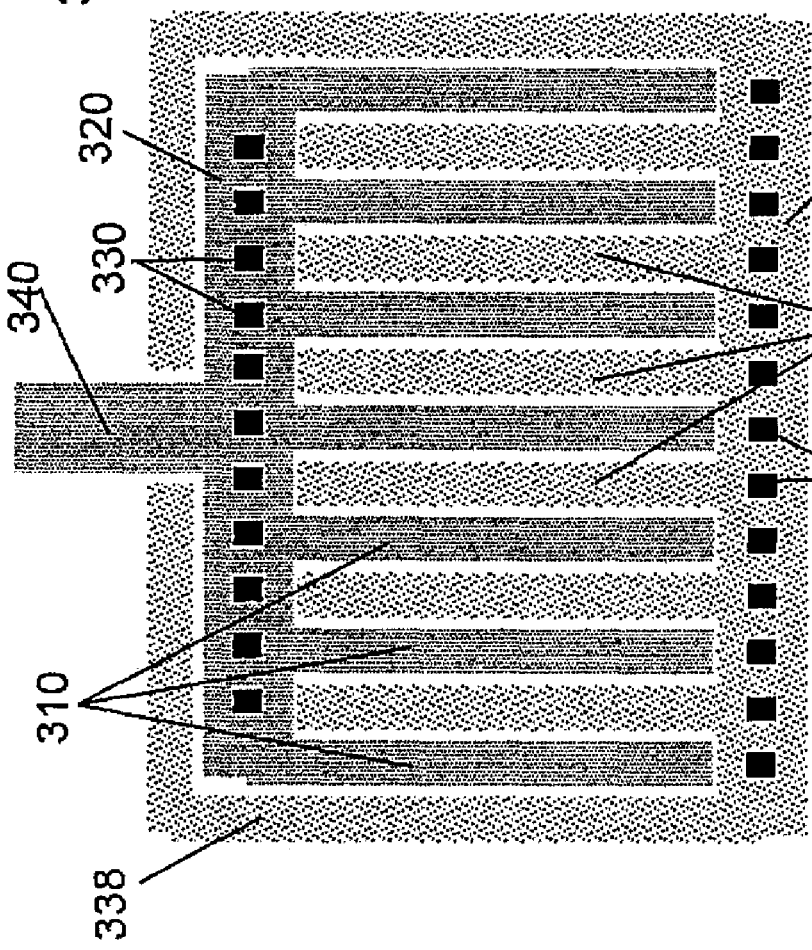
Figure 6:
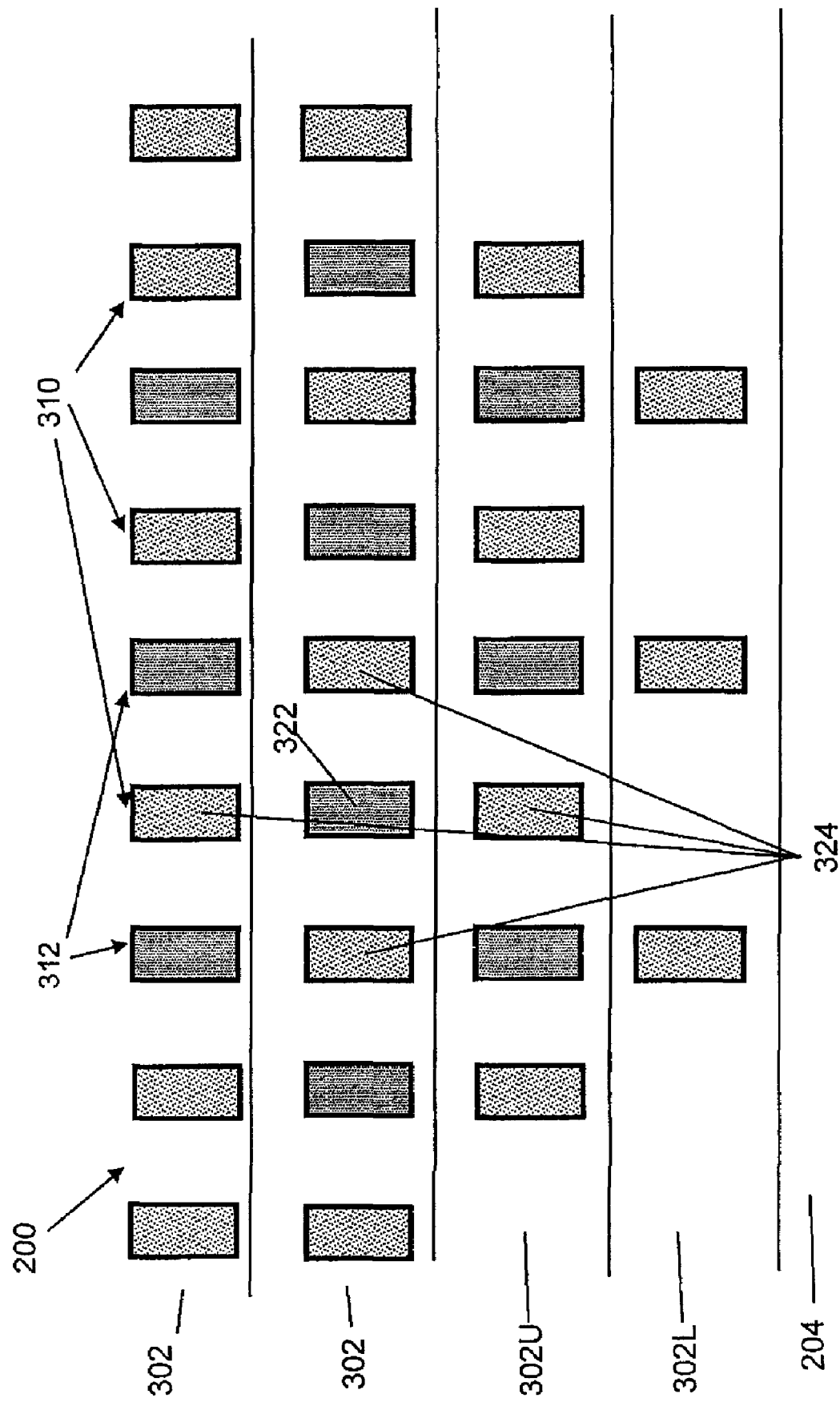
FIG. 6 shows a cross-sectional view of a variation of the third embodiment of a capacitor.

FIGS. 5A-B and 6 show a third embodiment of a capacitor 300 (FIG. 6 only). FIG. 5A shows one layer of capacitor 300 and FIG. 5B shows the next lower layer. FIG. 6 shows a cross-sectional view of a variation (smaller number of electrodes) of the third embodiment of capacitor 300. As shown in FIGS. 5A-B, the capacitor includes a first set of electrodes 310 extending from a first common hub 320 in each layer. First set of electrodes 310 have at least one electrode, e.g., 322 (FIG. 6), vertically and horizontally interspersed between at least two electrodes, e.g., 324 (FIG. 6), of second set of electrodes 312 extending from a second common hub 326. In addition, at least one electrode 324 extends to a great depth than each electrode 322 of the first set. As shown in FIGS. 5A-B and 6, common hub 320 couples first electrode set 310 and is coupled between BEOL layers 302 by vias 330. Similarly, common hub 322 couples second electrode set 312 and is coupled between BEOL layers 302 by vias 332. As also shown in FIG. 6, and as described above, second set of electrodes 312 may also be positioned at a greater depth in BEOL layers 302 above substrate 304 than first set of electrodes 310. Second electrode set 312 may include a cathode and first electrode set 310 may include an anode. As in the earlier-described embodiment, the cathode (second electrode set 312) is laterally outside of the anode (second electrode set 310) such that sidewall capacitance is reduced.

In an alternative embodiment, as shown in FIGS. 5A-5B, cathode (second electrode set 312) may be formed to include a wrap around portion 338 in each layer to surround the anode (first electrode set 310 and common hub 320), and a tab 340 may extend from common hub 320 of first electrode set 312 at one layer (FIG. 5B) for interconnection purposes. Parasitic capacitance, in this case, is isolated to tab 340.

As also described herein, and as shown in FIG. 6, BEOL layer 302L closest to substrate 304 includes fewer electrodes than at least one BEOL layer 302U farther from substrate 304, i.e., FIG. 5B, which is below FIG. 5A, includes fewer electrodes, and each BEOL layer may includes more (or the same number of) electrodes than a BEOL layer therebelow, i.e., closer to substrate 104. The FIGS. 5A-B and 6 embodiment may also include first and second set of electrodes 310, 312 having one of: a substantially pointed cross-sectional profile, a substantially U-shaped cross-sectional profile and a substantially arced point cross-sectional profile, as shown in FIGS. 3A-D. As is appreciated, any variation of the above-described embodiments may also be employed and are considered within the scope of the invention.

The capacitors as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A capacitor comprising:
  a substrate;
  a plurality of back-end-of line (BEOL) layers disposed above the substrate;
  a first set of electrodes extending from a first common hub, wherein each electrode of the first set extends through at least one of the plurality of BEOL layers;
  a second set of electrodes extending from a second common hub, wherein each electrode of the second set extends through at least one of the BEOL layers, wherein the second set of electrodes extends at a depth through the plurality of BEOL layers that differs from the depth that the first set of electrodes extends through the plurality of BEOL layers; and
  wherein a BEOL layer from the plurality of BEOL layers that is closest to the substrate includes fewer electrodes from the first set of electrodes and the second set of electrodes than at least one BEOL layer above that is farther from the substrate, and wherein each BEOL layer from the plurality of BEOL layers includes more electrodes from the first set of electrodes and the second set of electrodes than a BEOL layer therebelow, and wherein the first set of electrodes has at least one electrode vertically and horizontally interspersed between at least two electrodes of the second set of electrodes.

* * * * *